United States Patent [19]

Segilia

[11] Patent Number: 5,319,312
[45] Date of Patent: Jun. 7, 1994

[54] APPARATUS FOR LOCATING INOPERATIVE MINIATURE BULBS IN A STRING OF BULBS

[76] Inventor: Rocco F. Segilia, 177 White Plains Rd. 47C, Tarrytown, N.Y. 10591

[21] Appl. No.: 908,391

[22] Filed: Jul. 6, 1992

[51] Int. Cl.$^5$ .................. G01R 31/02; G01R 31/08
[52] U.S. Cl. ..................................... 324/556; 324/508; 324/512; 324/537; 324/133; 324/414; 340/642
[58] Field of Search .............. 324/508, 512, 537, 543, 324/550, 555, 556, 414, 133; 340/641, 642

[56] References Cited

U.S. PATENT DOCUMENTS

| | | | |
|---|---|---|---|
| 1,868,689 | 7/1932 | Brander | 340/642 X |
| 3,725,780 | 4/1973 | Olin | 324/414 |
| 3,760,266 | 9/1973 | Ocasio et al. | 324/414 |
| 4,491,781 | 1/1985 | McClintic | 324/543 |
| 4,727,449 | 2/1988 | Fleck | 340/642 X |
| 4,918,392 | 4/1990 | Torres | 324/537 |
| 4,943,752 | 7/1990 | Todd et al. | 324/414 X |
| 5,008,626 | 4/1991 | Boyd | 324/414 |
| 5,047,721 | 9/1991 | Farley | 324/414 |

Primary Examiner—Kenneth A. Wieder
Assistant Examiner—Glenn W. Brown
Attorney, Agent, or Firm—Martin J. Spellman, Jr.

[57] ABSTRACT

Apparatus for determining which bulb or bulbs in a string of miniature incandescent light bulbs is burned out. The apparatus includes a socket adaptor with wire contacts at the base thereof for making conductive contact with both circuit contacts in the base of a selected bulb socket in the light circuit. Light emitting diodes are located within the adaptor body between each wire contact and a junction connected to one contact of a battery. The other contact of the battery is connected to both contacts of a female receptacle body. The male plug of the light circuit is inserted into the female receptacle of the socket adaptor, thus placing both ends of the string of bulbs in connective communication with one contact of the battery. The diodes are located in the socket adaptor body so that when either diode lights up, the direction in the light circuit of the inoperative bulb is indicated.

2 Claims, 2 Drawing Sheets

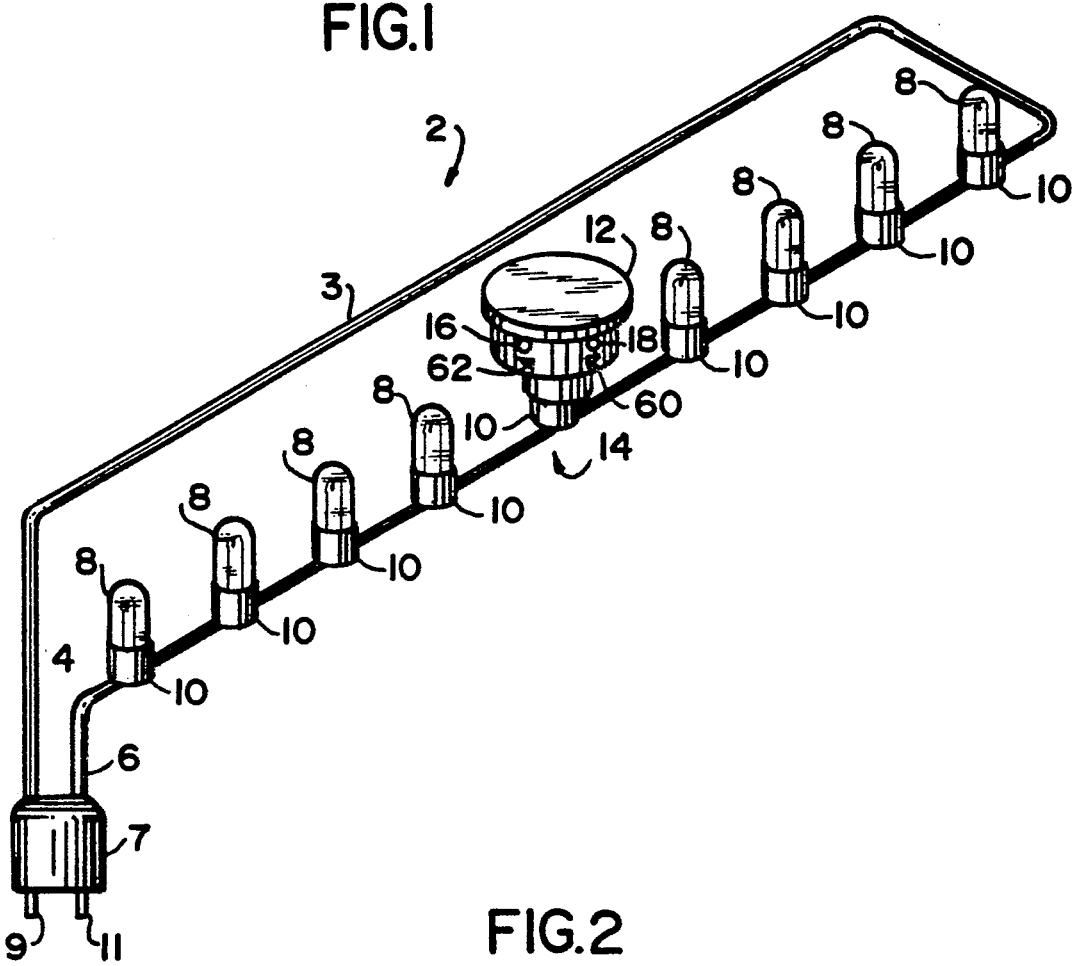
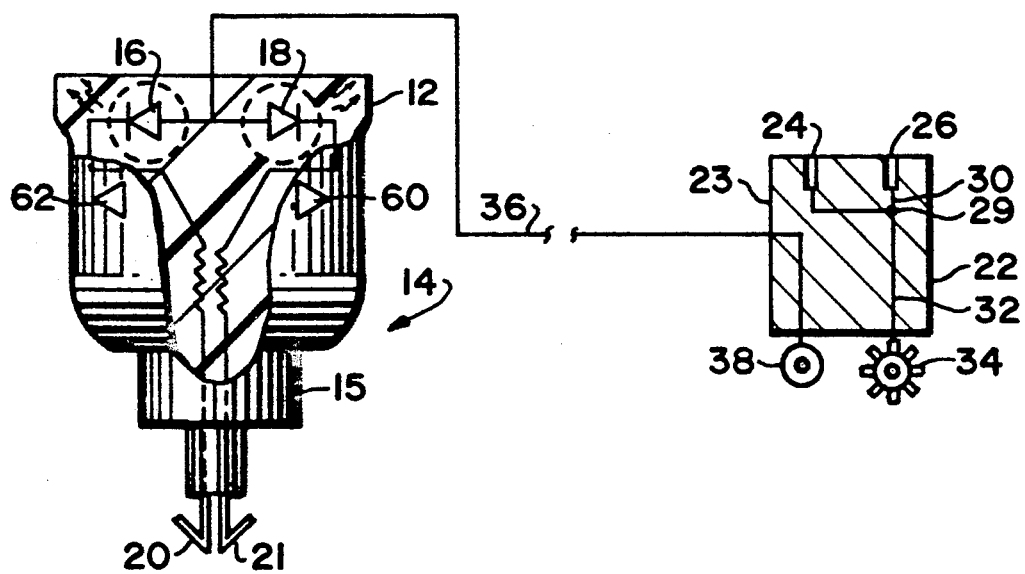

APPARATUS FOR LOCATING INOPERATIVE MINIATURE BULBS IN A STRING OF BULBS

BACKGROUND OF THE INVENTION

1. Field of the Invention

The present invention is concerned with an apparatus and method for testing strings of miniature incandescent light bulbs to locate inoperative bulbs. Strings of miniature incandescent light bulbs are extremely popular currently for various decorative purposes. One of the most common is for decoration of Christmas trees. The sets are usually strung in series with a minimum of 15 bulbs or more. Since the lamp filaments are generally 2.5 to 7 volts and in series, the total filament voltage should add up to 110 to 120 volts of common household current. Sets with large numbers of bulbs are generally divided into multiple sections in which the bulbs in each section are connected in series. When one bulb fails, a whole section fails to light and it is very frustrating and time consuming to locate and replace the failed bulb. Usually many bulbs have to be checked and replaced before finding the failed bulb.

While there are presently various apparatus available for testing individual bulbs there is no apparatus presently known which is inexpensive, simple to use and can be used to rapidly locate the failed bulb by removing one bulb and connecting the apparatus of the present invention to the bulb socket to determine if that is the failed bulb and if it is not, the direction on the string of bulbs to the location of the failed bulb.

2. Prior Art

U.S. Pat. No. 4,943,752, Todd. While this reference specifically discloses a Christmas tree lamp tester which is simple and utilizes a portable 9 volt battery, it fails to eliminate the need of testing multiple individual lamp bulbs, more or less blindly, since it gives no indication as to the direction of the failed lamp if the socket selected randomly is not the socket of the failed lamp. It uses a piezoelectric circuit suitable for testing Christmas tree lights and related devices. The device, however is suitable for testing only bulbs singularly by inducing a spark across a broken filament of the bulb.

U.S. Pat. No. 5,008,626, Boyd. Also discloses a portable DC miniature lamp tester which includes a translucent plastic body with an open socket for receiving the bayonet end of the lamp, and terminals connecting to a nine volt dry cell battery. This is specifically designed for testing light strings.

The general difficulties in testing Christmas tree lamps are discussed in column 1 of this patent which also refers to the Olin U.S. Pat. No. 3,725,780 which specifically discloses a Christmas tree lamp tester that utilizes a nine volt battery.

U.S. Pat. No. 5,047,721, Farley. Shows a detector for testing a string of lights; i.e. Christmas tree lights by providing means for testing lamps without removing the lamps from the sockets utilizing capacitor plates. Once again, no directional capability is disclosed.

U.S. Pat. No. 3,760,266, Ocasio, Tuman. Shows a simple Christmas tree light socket tester to determine which in a series of lights is burned out. Again, no directional capability is disclosed.

SUMMARY OF THE INVENTION

The present invention provides an apparatus and method for quickly and easily determining which bulb or bulbs in a series circuit of miniature Christmas tree lights is inoperative.

Such sets of miniature lights have become very popular in recent years. They comprise a wire conductor with each of the two ends thereof connected to a prong of a male plug suitable for connection with a common household receptacle outlet supplying 110–120 non polarized alternating current.

Generally, there are about at least 15 miniature bulb sockets placed in series on the wire conductor of the type for receiving miniature lamps with bent wire contacts. The wattage of the bulbs is usually for 2.5 to 7 watts. The number of sockets and bulbs in a series should be sufficient so that the voltage drops across the circuit add up to 110 to 120 volts of the source current.

As indicated above since such sets are in series, when one bulb becomes inoperative the whole string series will not light. At present, in order to find the inoperative bulb, a completely blind sequential check must be started of removing and replacing each bulb in the series until the inoperative bulb is found. This could be the first or last bulb checked or any one in between. This procedure is time consuming and frustrating.

The present invention provides an apparatus and method for easily and quickly locating the inoperative bulb(s).

The apparatus includes a socket adaptor body with wire contacts at the base thereof for making conductive contact with both circuit contacts in the base of a socket for a bulb in the circuit.

Within the adaptor body a conductive lead from each wire contact has a directional light emitting diode between the wire contact and a junction of both of said leads with a conductor of approximately 15 feet in length from a female plug receptacle body and ultimately from one contact of a direct current battery source such as a 9 V transistor battery.

The other pole of the battery is in conductive communication with both metal contacts of the receptacles of the female plug body.

Between each of the diodes and the leads from the wire contacts it is desirable to have current limiting resistors, typically of 1 k /¼ watt.

The diodes are located in the socket adaptor body so that when either lights up due to flow of current therethrough it will signify the direction on the bulb circuit of the inoperative bulb. This is accomplished by juxtaposing the position of each diode from the side of the adaptor body from the metal socket contact for that diode.

To find the location of a inoperative bulb, the male plug for the light circuit is inserted into the female plug receptacle and thus both ends of the string conductor are in conductive communication with one pole of the battery. A bulb in the defective light string is removed and the socket adaptor base placed in the socket. A circuit is then completed through the socket adaptor and the diode in conductive communication with the portion of the string not having the inoperative bulb. Since the light emitting diodes are juxtaposed, the lighted diode will signify the direction in the string to the location of the inoperative bulb.

If both diodes light, the inoperative bulb was the one removed for the adaptor.

If neither diode lights, more than one lamp is inoperative and you should start at a bulb adjacent to the plus at one end of the string circuit. This method will rapidly bracket and locate the inoperative bulb greatly diminishing the necessary time to locate the inoperative bulb(s).

Indicia may be placed on the socket adaptor body outer surface adjacent each diode light to further aid in indicating the direction of the failed bulb.

BRIEF DESCRIPTION OF THE DRAWING

In the accompanying drawing which forms a part of the specification.

FIG. 1 is a perspective view of a string of decorative Christmas tree lights with the bulbs and sockets therefore in series and having an adaptor for the apparatus of the present invention connected to a socket from which a bulb has been removed;

FIG. 2 side plan view of the adaptor body and schematic of the plug receptacle;

DESCRIPTION OF ILLUSTRATIVE EMBODIMENT

Figure 3:
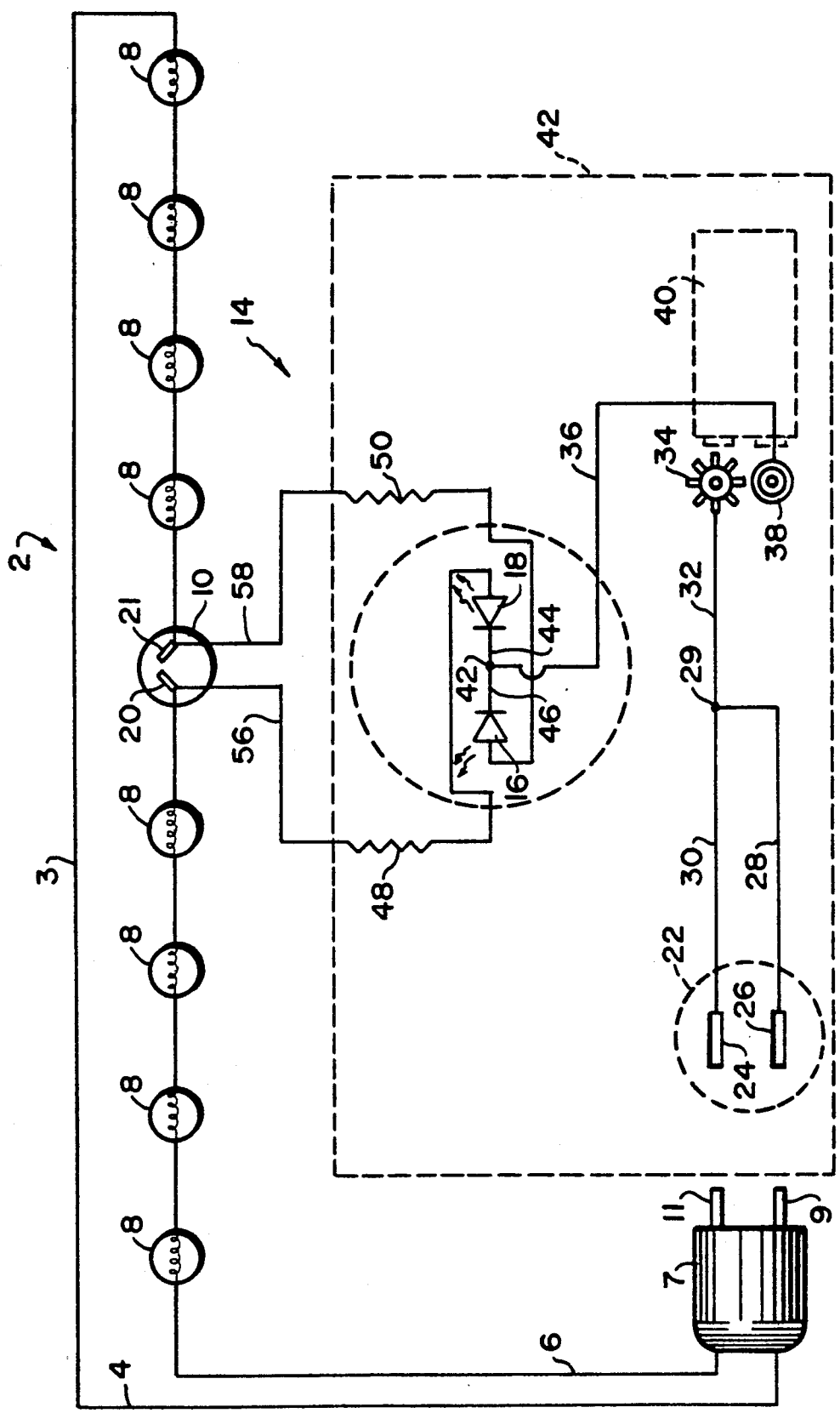
FIG. 3 is an overall electrical schematic of the apparatus of the present invention.

Referring to the accompanying drawing, in FIG. 1, there is shown a typical string of decorative Christmas tree lights 2. The set comprises the wire conductor 3 which constitutes the line that is connected at each end 4 and 6 thereof to a conventional male plug 7 with connector prongs 9 and 11. The lamps or bulbs 8 are connected to the circuit through the lamp sockets 10.

The socket adaptor 12 portion of the apparatus 5 includes the body portion 14, light emitting diodes 16 and 18, the base 15 for placement in the socket 10 and the wire prongs 20 and 21 to make electrical connections in the socket 10 to the sides 4 and 6 of the string 3.

The female receptacle plug body 22 includes socket contacts 24 and 26 to leads 28 and 30 respectively which are joined at 29 to line 32 between juncture 29 and battery contact 34. The conductive lead 36 connects adaptor body 14 with battery connector 38.

In FIG. 3, a 9 volt transistor battery 40 is shown. The dotted line 5 indicates the apparatus of the invention.

Within the body 14 of the adaptor 12 the lead 36 from the socket receptacle 22 and battery connector 38 branches at 42 into two segments 44 and 46 which each have directional light emitting diodes 16 and 18 respectively.

The leads 56 and 58 from contacts 20 and 21 respectively are connected to diodes 16 and 18 respectively, as shown in FIG. 3, and have current limiting resistors 48 and 50 therein of 1 k /¼ watt.

The diodes are 3 volt D.C.-50 ma.

The light emitting diode 18 will light up if the failed bulb is to the left of the adaptor 12 in the string 3 and the diode 16 will light if the failed bulb is to the right in the string 3 as shown in FIG. 3.

The side 15 of the body 14 is provided with directional arrows indicia 60 and 62 under the diodes 16 and 18 respectively on the side 15 to indicate the direction of the bulb 8 which is out.

If both diodes 16 and 18 light, the socket 10 into which the adapter 12 is plugged is that of the failed bulb. If neither diode 16 nor 18 lights, there is more than one failed bulb 8 and you should start from the plug side of segment 4 or 6.

While the invention has been described by reference to an illustrative embodiment, it is not intended that the novel device be limited thereby, but that modifications thereof are intended to be included as falling within the broad spirit and scope of the foregoing disclosure, the following claims and the appended drawings.

What is claimed is:

1. Apparatus for determining the location of an inoperative bulb in a series circuit of decorative bulbs, the circuit including sockets in which each of said bulbs is held, each said socket having circuit contact means for making conductive contact from said bulbs to said circuit; both ends of said circuit joined to a male plug having a pair of conductive prongs, said apparatus comprising: a bulb socket adaptor body, said adaptor body having a first and a second contact at a base thereof for making conductive contact with the circuit contact means of a selected socket, said adaptor body contacting a first and a second side of said circuit, conductive means for making conductive contact from each of said contacts to a light emitting diode, conductive means for making conductive contact from both of said diodes to one side of a direct current source, a female socket with conductive receptacles therein adapted to receive said prongs of said male plug, and said conductive receptacles being conductively connected to a second side of said direct current source.

2. Apparatus as claimed in claim 1 wherein said diodes are placed in said body so as to indicate, when lighted, the direction in said series circuit of the location of an inoperative bulb in said series circuit.

* * * * *